United States Patent [19]

Joosten et al.

[11] 4,024,434

[45] May 17, 1977

[54] CIRCUIT ARRANGEMENT IN A TELEVISION RECEIVER PROVIDED WITH A LINE DEFLECTION CIRCUIT AND A SWITCHED SUPPLY VOLTAGE CIRCUIT

[75] Inventors: Louis Gerardus Josephus Joosten, Eindhoven; Wim Bosboom, Nijmegen; Wilhelmus Theodorus Hendrikus Hetterscheid, Nijmegen; Gerrit Pieter Johannes Van Schaik, Nijmegen, all of Netherlands

[73] Assignee: U.S. Philips Corporation, New York, N.Y.

[22] Filed: Apr. 11, 1975

[21] Appl. No.: 567,317

[30] Foreign Application Priority Data

Apr. 29, 1974 Netherlands ............... 7405726

[52] U.S. Cl. .................. 315/410; 315/387; 315/389; 315/408; 315/409

[51] Int. Cl.² .................................. H01J 29/74
[58] Field of Search .......... 315/387, 389, 408, 409, 315/410

[56] References Cited

UNITED STATES PATENTS 3,912,971  4/1975  Houkes ..................... 315/387

Primary Examiner—Maynard R. Wilbur
Assistant Examiner—S. C. Buczinski
Attorney, Agent, or Firm—Frank R. Trifari; Henry I. Steckler

[57] ABSTRACT

A supply voltage arrangement in a television receiver, which arrangement is switched at line frequency. The diode of the arrangement is shunted by the series combination of a capacitor and a primary winding of a transformer, a secondary of which controls the switch in the line deflection circuit.

3 Claims, 3 Drawing Figures

CIRCUIT ARRANGEMENT IN A TELEVISION RECEIVER PROVIDED WITH A LINE DEFLECTION CIRCUIT AND A SWITCHED SUPPLY VOLTAGE CIRCUIT

The invention relates to a circuit arrangement in a television receiver provided with a line deflection circuit for generating a line-frequency deflection current with a trace and a retrace through a deflection coil, which circuit includes a first switch controllable at the line frequency, and with a supply voltage circuit which is switched also at the line frequency and includes a second switch controllable at the line frequency, a diode and an inductance, across which inductance a retrace pulse is produced originating from the line deflection circuit, the first switch having a control signal applied to it originating from the supply voltage circuit.

In such a circuit arrangement usually the time during which the second switch is conductive is controlled to maintain the generated supply voltages and the amplitude of the deflection current constant in the case of mains voltage variations. For this purpose, in principle the switch-on instant and the switch-off instant of the second switch may coincide with any instant of the period.

The first switch, which often is a transistor, is shunted by a diode which with some types of transistor is the collector base diode thereof. During the retrace time both elements are non-conductive, whilst the diode conducts during a first part of the trace time and the transistor conducts during the remainder of the trace time. Hence the switch-on and switch-off instants of the first switch are not arbitrary, i.e. they are fixed with respect to the trace and retrace times of the deflection current which are determined by the line synchronizing pulses received. If, however, the transistor is rendered conductive before the middle of the trace time, this has no consequences, because the deflection current flows through the diode.

Consequently the control signal for the first switch may be derived from the supply circuit in spite of the variation of the time during which the second switch conducts, provided that this signal renders the first switch conductive at the earliest at the beginning and at the latest at about the middle of the trace time and renders it non-conductive at the end of this time. It would appear to be obvious to control both switches from the same source, however, this source then would have to satisfy very high requirements because the two control currents are large, necessitating the use of a third power transistor.

Another possibility is to control the first switch by means of the voltage set up across a winding coupled to the inductance of the switched supply circuit. However, the said inductance has a retrace pulse applied to it originating from the deflection circuit, which pulse is produced across the deflection coil after the first switch is rendered non-conductive. This pulse is also applied with blocking polarity to the base of the first switch, causing large or even inadmissible dissipation in the base-emitter diode, and also the pulse may be limited to the zener voltage of this diode, which may give rise to distortion of the pulse and hence of the deflection current.

It is an object of the present invention to avoid the said disadvantages and for this purpose the circuit arrangement according to the invention is characterized in that the series combination of a capacitor and a primary winding of a transformer is connected in parallel with the diode, an end of a secondary winding of the transformer being coupled to a control electrode of the first switch.

The invention is based on the recognition that a rectangular voltage, i.e. a voltage containing no retrace pulse, is set up across the transformer. According to a further recognition the winding sense of the windings of the transformer may be such that the first switch conducts in the time interval during which the diode is non-conductive. This choice of the conductive interval causes the first switch to be rendered and maintained conductive by a non-stabilised voltage, the value of this voltage increasing according as the conduction time of the switch in the form of a power transistor is shorter if the mains voltage increases, and conversely. This has the advantageous effect that the switch-off time of the first switch substantially does not vary.

Embodiments of the invention will not be described, by way of example, with reference to the accompanying diagrammatic drawings, in which.

Figure 1:
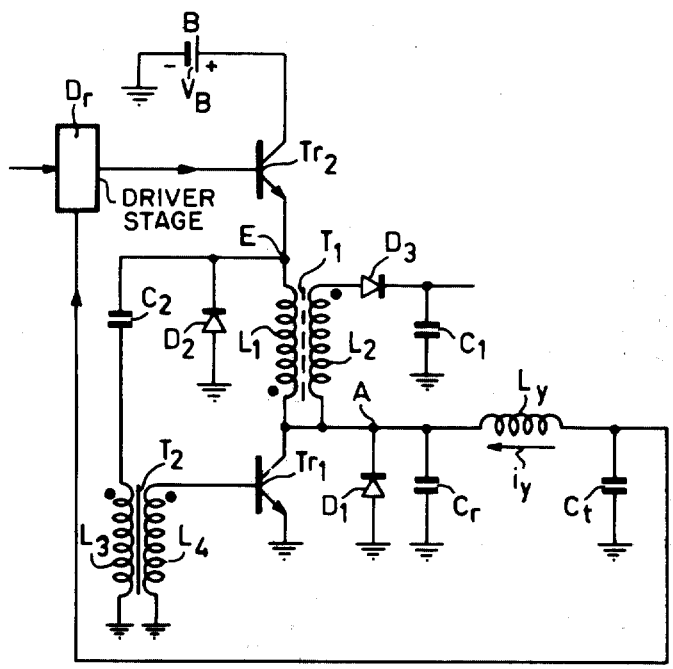
FIG. 1 is a circuit diagram showing the basic elements of a first embodiment of a circuit arrangement according to the invention.

Referring now to FIG. 1, $Tr_1$ denotes a switching transistor of the npn type the collector of which is connected to the cathode of a diode $D_1$, to a retrace capacitor $C_r$ and to a line deflection coil $L_y$. A trace capacitor $C_t$ is connected in series with the coil $L_y$, and the free ends of the elements $D_1$, $C_r$ and $C_t$ and the emitter of the transistor $Tr_1$ are connected to one another. They may be connected to the earth of the circuit arrangement. The said elements are the basic elements only of the line deflection circuit of a television receiver not shown further. The circuit arrangement may in known manner be provided, for example, with one or more transformers for intercoupling the elements, with centering and linearity correction arrangements and the like.

One end of a primary winding $L_1$ of a transformer $T_1$ is connected to the junction A of the elements $Tr_1$, $D_1$, $C_r$ and $L_y$, and the other end is connected to the emitter of a switching transistor $Tr_2$, also of the npn type, and to the cathode of a diode $D_2$. The collector of the transistor $Tr_2$ is connected to the positive terminal of a direct-voltage source B the negative terminal of which is earthed, as is the anode of the diode $D_2$.

A driver stage Dr to which signals from a line oscillator, not shown, are applied applies switching pulses to the base of the transistor $Tr_2$. The core of the transformer $T_1$ carries secondary windings across which voltages are produced which serve as supply voltages for other parts of the receiver. One of these windings, $L_2$, is shown in FIG. 1 and by means of a rectifier $D_3$ sets up a positive direct voltage across a smoothing capacitance $C_1$. The winding $L_2$ may be the high-voltage winding, in which case the voltage set up across the capacitor $C_1$ is the high voltage for the display tube (not shown).

The base of the transistor $Tr_1$ is controlled by a secondary winding $L_4$ of a transformer $T_2$ a primary $L_3$ of which is in series with a capacitor $C_2$, the series combination being connected in parallel with the diode $D_2$. The winding sense of the various windings is indicated in FIG. 1 by polarity dots.

The deflection part of the apparatus shown in FIG. 1 operates in known manner. During a first part of the trace time the diode $D_1$ conducts. The voltage across the capacitor $C_t$ is applied to the coil $L_y$, through which a sawtooth deflection current $i_y$ flows. At a given instant the transistor $Tr_1$ is rendered conductive. At about the middle of the trace time the current $i_y$ reverses direction so that the diode $D_1$ is rendered non-conductive. The current $i_y$ then flows through the transistor $Tr_1$. At the end of the trace time the transistor $Tr_1$ is rendered non-conductive. At the junction point A an oscillation is produced, the retrace pulse, which reaches a high value at the middle of the retrace time and then decreases. When the voltage across the capacitor $C_r$ becomes zero again, the diode $D_1$ is rendered conductive: this is the beginning of a new trace time.

The winding $L_1$ supplies energy to the deflection part to compensate for losses, which energy is derived from the source B. During a part of the period the transistor $Tr_2$ is conductive, its emitter current flowing through the winding $L_1$ to the junction point A. During the remainder of the period the transistor $Tr_2$ is non-conductive. Its function is taken over by the diode $D_2$. Current then flows through this diode and the said winding to the point A. The waveform of the voltage $v_E$ at the emitter E is shown in FIG. 2a which shows that it alternately is equal to 0 and to the voltage $V_B$ of the source B. It assumes the latter value during that part $\delta$ $T_H$ of the line period $T_H$ during which the transistor conducts. The voltage drops across the transistor $Tr_2$ and the diode $D_2$ are here disregarded.

FIG. 2b shows the voltage $v_A$ at the point A, which is substantially zero during the trace time of the current $i_y$. During the retrace time $\tau$ the substantially sinusoidal retrace pulse occurs. $V_o$ denotes either the direct voltage which is set up across the capacitor $C_t$ if the latter has a sufficiently large capacitance, or the direct-voltage component of the voltage across the capacitor if the latter has a comparatively small capacitance in view of so-called S correction, i.e. the mean value of the voltage $v_A$, for no direct-voltage component can be produced across the coil $L_y$. The voltage $V_o$ is stabilised in known manner, for example, by means of feedback to the driver stage Dr in which a comparison stage and a modulator ensure that $\delta$ is varied so that the voltage $V_o$ and hence the amplitude of the current $i_y$ are maintained constant. The instant at the beginning of the time $\delta T_H$ at which the leading edge of the voltage $v_E$ occurs varies and, as is well known, $V_o = \delta . V_B$.

The voltage $v_{L_1}$ across the winding $L_1$ is equal to the difference between the voltages $v_E$ and $V_A$ and is plotted in FIG. 2c, the area of the negative pulse being equal to that of the rectangle during the time $\delta T_H$.

If the transistor $Tr_1$ where separately controlled in known manner, the positon of the retrace pulse in FIG. 2b might be arbitrary with respect to the rectangular waveform of FIG. 2a. However, this is not the case, because the control signal for the transistor $Tr_1$ of FIG. 1 is derived from the emitter of the transistor $Tr_2$. As will be explained hereinafter, the transistor $Tr_1$ is switched off a time after an interval $t_d$ after the transistor $Tr_2$ has been rendered non-conductive. Hence in the waveform of FIG. 2c a negative-going retrace pulse is produced with a delay $t_d$ after the edge which occurs at the end of the time $\delta T_H$.

At first sight the waveform of FIG. 2c is suitable for controlling the transistor $Tr_1$, so that it would appear that the voltage $v_{L_1}$ can simply be applied through a transformer to the base of the transistor. However, during the time $t_d$ the voltage $v_{L_1}$ is zero and hence cannot switch off the transistor. The only effect is a decrease of the base current. During the time $\tau$ the negative voltage at the base becomes very high, resulting in a large or even inadmissible dissipation in the base emitter diode whilst moreover the pulse may be limited to the zener voltage of this diode, which may give rise to distortion of the pulse and hence of the deflection current.

According to the invention the rectangular voltage set up across the diode $D_2$ is used, which voltage contains no retrace pulse and is applied via the transformer $T_2$, which steps it down, to the base of the transistor $Tr_1$. The transformer $T_2$ can also be carried out as an autotransformer. The capacitor $C_2$ prevents a direct-current short-circuit of the diode $D_2$ by the winding $L_3$ and has a capacitance which is large enough to prevent the variations of the voltage $v_{L_3}$ across the winding $L_3$ from being affected. Thus the voltage across the capacitor $C_2$ is equal to $V_o$. The voltage $v_{L_3}$, which is plotted against time in FIG. 2d, is equal to the difference $v_E - V_o$. Hence $v_{L_3}$ is equal to $V_B - V_o$ during the time $\delta T_H$ and to $V_o$ during the remainder of the period. Because the mean value of the voltage $v_{L_3}$ must be zero, the areas of the parts above and beneath the time axis are equal to one another and to $(1-\delta)V_o$.

The polarity of the control voltage for the transistor $Tr_1$ is the same as that of FIG. 2d, so that during the time $(1-\delta)T_H$ in which the diode $D_2$ conducts a voltage of constant amplitude is applied to the transistor, rendering it non-conductive, and during the time $\delta T_H$ in which the diode does not conduct a voltage of non-stabilised amplitude is applied to the transistor, rendering it conductive. After the descending edge at the end of the time $dT_H$ the transistor remains conductive during the aforementioned time interval $t_d$, until the amount of charge carriers removed from its base is such that the transistor becomes unsaturated. This delay depends not only upon the transistor and the signals, but also upon the inductances in the base circuit.

If the base voltage rendering the transistor conductive were constant, the time $t_d$ might vary as a function of the ratio $\delta$ and hence as a function of the voltage $V_B$, for if the conduction time is shorter, with a constant base voltage the storage time for the charge carriers is shorter. Owing to the said choice of the polarity of the base voltage the base current is greater as the conductive time $\delta T_H$ is shorter, which is the case when the voltage $V_B$ increases, for example owing to an increase in the mains voltage from which the voltage $V_B$ is derived. Conversely, the base current is smaller as $\delta$ is greater. As a result, the switch-off time substantially does not vary and hence the phase position of the time $\tau$ with respect to the period $T_H$ also is substantially constant.

Figure 2:
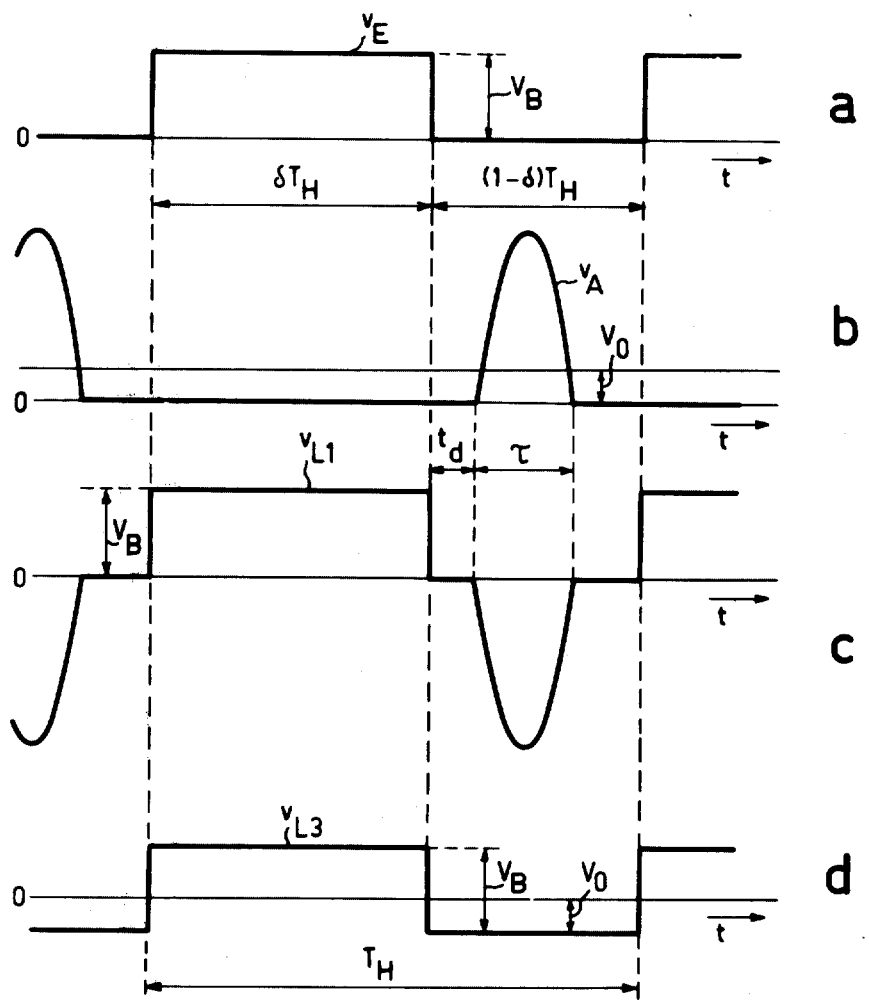
FIG. 2 shows voltage wave forms produced in the circuit arrangement.

FIG. 2 shows that the value of the ratio $\delta$ is not arbitrary. The transistor $Tr_1$ conducts during the time $\delta T_H + t_d$, which time at most is equal to the trace time and at least is equal to one half of the trace time. Consequently, $\delta$ must satisfy the following condition:

$$(1-z)(T_H 2) \leq \delta T_H + t_d \leq (1-z)T_H$$

where $z = \tau/T_H$) is the retrace ratio, and from which follows $$\tfrac{1}{2}(1-z) - (t_d/T_H) \leq \delta \leq 1-z - (t_d/T_H)$$

With $T_H \approx 64$ μs (625 lines per picture and a field frequency of 50 Hz, or 525 lines per picture and a field frequency of 60 Hz), $t_d \approx 10$ μs and $z \approx 0.2$, the condition is:

$$0.25 \leq \delta \leq 0.65.$$

Without the delay $t_d$ the limit values would have been 0.4 and 0.8, which figures are in a ratio of 2, whereas with the occurrence of the delay the same ratio is 2.6. This yields a larger control range, dispensing with the need for known special steps such, for example, as the use of a diode $D_1$ having a long recovery time.

Figure 3:
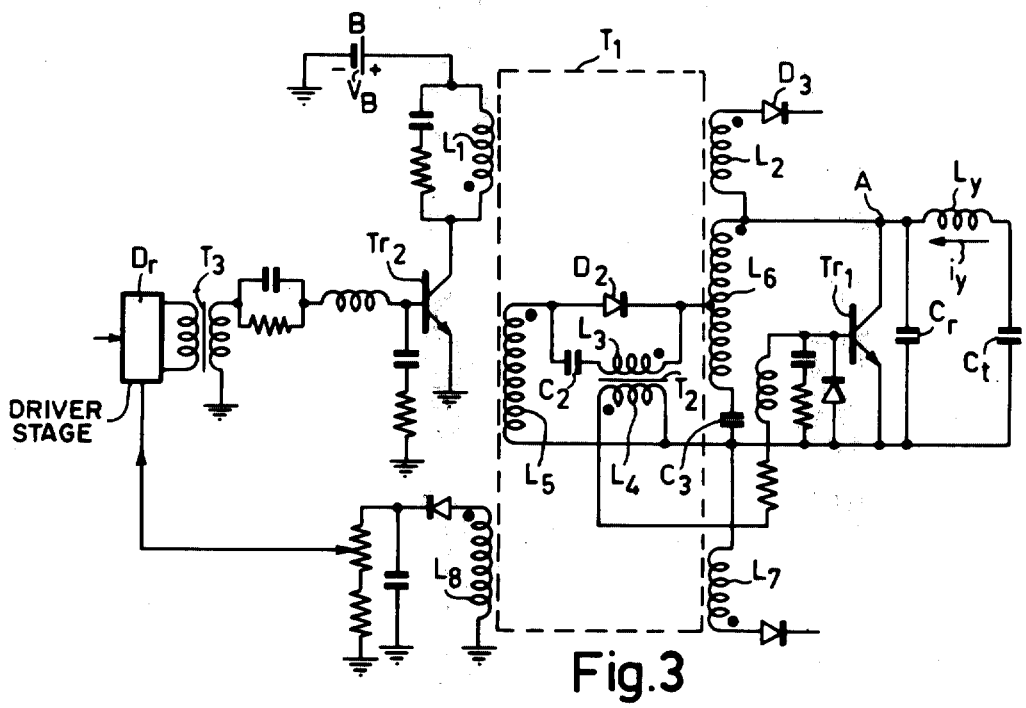
FIG. 3 is a circuit diagram showing the basic elements of a second embodiment of the arrangement according to the invention.

FIG. 3 shows in more detail an embodiment which uses an arrangement described more fully in our copending U.S. patent applicants Ser. Nos. 484,586, filed July 1, 1974 now U.S. Pat. No. 3,950,674 and 473,771, filed May 28, 1974. Elements of FIG. 3 which correspond to elements of FIG. 1 are designated by the same symbols, and known elements which are not of importance to the present invention are not discussed. A winding $L_5$ coupled to the winding $L_1$ is connected to the anode of the diode $D_2$ the cathode of which is connected to a tapping on a winding $L_6$. A capacitor $C_3$ is connected in series with the winding $L_6$. The other end of the winding $L_6$ is connected to the junction point A of the elements $Tr_1$, $C_r$, and $L_y$. The transistor $Tr_1$ may be of the type Philips BU 208, the diode $D_1$ being replaced by the collector-base diode of this transistor. The free ends of the elements $C_3$, $C_r$, $C_t$ and $L_5$ and the emitter of the transistor $Tr_1$ are connected to one another and to the earth of the arrangement. The windings $L_1$, $L_2$, $L_5$ and $L_6$ and the windings for generating auxiliary supply voltages, only one of which, $L_7$, is shown in FIG. 3, are wound on the core of the transformer $T_1$. This core is shown as a rectangle. The voltage across a further winding $L_8$ of the transformer $T_1$ is rectified, and an adjustable part of the resulting direct voltage is fed back for purposes of stabilisation to a modulator which forms part of the driver stage Dr for influencing the ratio $\delta$.

The construction of FIG. 3 provides the advantage that the deflection circuit of the arrangement, the high-voltage circuit and the auxiliary supply voltage circuit, i.e. in FIG. 3 the winding $L_5$ and the elements to the right thereof, can be isolated from the public mains. This means that those ends of the elements to the left of the winding $L_5$ which carry no voltages are connected to the neutral conductor of the mains from the earth of the arrangement is isolated. Without the step according to the invention the base of the transistor $Tr_1$ would have to be controlled, either by means of a secondary of the driver transformer $T_3$ which controls the base of the transistor $Tr_2$, which would impose high requirements on the driver stage so that a third power transistor would be required, or by means of a separate driver stage. In both cases the insulation of these elements would have to comply with exacting requirements. These disadvantages are removed if the base of the transistor $Tr_1$ is controlled by means of a winding of the transformer $T_1$, because some of its windings must be isolated from the mains supply in any case. In addition, during the time $t_d$ the voltage across such a winding may not be zero but may be negative, the negative value depending upon the position of the tapping on the winding $L_6$ and being high enough to ensure switch-off of the transistor $Tr_1$. However, the disadvantage remains that this voltage contains a retrace pulse the amplitude of which cannot be chosen at will, because the position of the tapping is defined for other reasons in our aforementioned U.S. patent application Ser. No. 484,586.

On termination of the conduction time $\delta T_H$ of the transistor $Tr_2$ the energy stored in the winding $L_1$ causes a current to flow through the diode $D_2$. Hence the voltage across it is substantially zero. The diode continues to conduct until the transistor $Tr_2$ is again rendered conductive, the energy in the winding $L_5$ being transferred to the winding $L_1$. During the time $\delta T_H$ the voltage across the winding $L_1$ is substantially equal to $V_B$, so that the voltage across the winding $L_5$ (between earth and the anode of the diode $D_2$) is equal to $-pV_B$, where $1:p$ is the ratio of the number of turns of the winding $L_1$ to that of the winding $L_5$. Because the voltage at the cathode of the diode $D_2$ then is positive, this diode $D_2$ is non-conductive, for at the tapping a voltage obtains which is equal to $(1-m)V_o$, where $1:m$ is the ratio of the number of turns of the entire winding $L_6$ to that of the part of this winding situated between the tapping and the end connected to the capacitor $C_3$. The said voltage has this constant value containing no retrace pulse during the entire time $\delta T_H$, provided that the transistor $Tr_1$ is controlled so that the retrace time of the deflection current $i_y$ does not fall within this time.

Under these conditions the voltage across the diode $D_2$ is rectangular and may be used to control the base of the transistor $Tr_1$ in the same manner as in the arrangement of FIG. 1, the above stipulation being satisfied. The transformer $T_2$ does not have to satisfy any requirements in respect of isolation from the mains supply.

It will be seen that the voltages set up across the various windings of the transformer $T_1$ do not have the same forms in spite of the fact that these windings are intercoupled. This is possible because the forms are not influenced by the coupling, since the voltages $V_a$ and $V_b$ which are impressed from outside are not influenced either. The currents flowing through the windings, however, are influenced by the coupling but without the operation being adversely affected. This is explained more fully in our aforementioned U.S. patent application Ser. No. 473,771. It will be evident that the step according to this Patent Application is of no importance for the present invention, i.e. the windings represented at left and at right, respectively, may form two separate transformers. This is also valid for the step according to the other Patent Application mentioned, which means the cathode of the diode $D_2$ may be connected directly to the point A.

What is claimed is:

1. Circuit arrangement for a television receiver provided with a line deflection circuit means for generating a line-frequency deflection current with a trace and a retrace through a deflection coil, which circuit means includes a first switch controllable at the line frequency, and with a supply voltage circuit which is switched also at the line frequency and includes a second switch controllable at the line frequency, a diode and an inductance, across which inductance a retrace pulse is produced originating from the line deflection circuit, means for applying to the first switch a control signal originating from the supply voltage circuit, wherein the improvement comprises a series combination of a capacitor and a primary winding of a transformer connected in parallel with the diode, an end of a secondary winding of the transformer being connected to a control electrode of the first switch.

2. Circuit arrangement as claimed in claim 1, wherein the first switch conducts during the time interval in which the diode is non-conductive.

3. Circuit arrangement as claimed in claim 1, in which the second switch and the inductance are corrected in series, and wherein the parallel connection of the diode and the said series combination of the a capacitor and the inductance is corrected to the primary winding.

* * * * *